(12) United States Patent
Lee et al.

(10) Patent No.: US 9,371,582 B2
(45) Date of Patent: Jun. 21, 2016

(54) METHOD FOR MANUFACTURING SILICON CARBIDE THIN FILM

(71) Applicant: National Tsing Hua University, Hsinchu (TW)

(72) Inventors: Chi-Young Lee, Hsinchu (TW); Ru-Chien Chiu, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 0 days.

(21) Appl. No.: 14/314,275

(22) Filed: Jun. 25, 2014

(65) Prior Publication Data
US 2015/0252471 A1 Sep. 10, 2015

(30) Foreign Application Priority Data

Mar. 10, 2014 (TW) .............................. 103108163 A

(51) Int. Cl.
| H05H 1/30 | (2006.01) |
| H05H 1/46 | (2006.01) |
| H05H 1/24 | (2006.01) |
| C23C 16/44 | (2006.01) |
| C23C 16/32 | (2006.01) |
| C23C 16/511 | (2006.01) |
| C23C 16/455 | (2006.01) |
| C23C 16/02 | (2006.01) |

(52) U.S. Cl.
CPC .............. *C23C 16/4412* (2013.01); *C23C 16/02* (2013.01); *C23C 16/325* (2013.01); *C23C 16/4405* (2013.01); *C23C 16/4407* (2013.01); *C23C 16/45557* (2013.01); *C23C 16/511* (2013.01)

(58) Field of Classification Search
CPC ...... H05H 1/24; H05H 1/0062; C23C 16/452; C23C 16/511
USPC .................................................. 427/575, 569
See application file for complete search history.

(56) References Cited

FOREIGN PATENT DOCUMENTS

| TW | 490497 B | 6/2002 |
| TW | 201214524 A | 4/2012 |

OTHER PUBLICATIONS

Rajagopalan et al. Low temperature deposition of nanocrystalline silicon carbide films by plasma enhanced chemical vapor deposition and their structural and optical characterization, J. App. Phys. (2003) 94, pp. 5252-5260.*

(Continued)

*Primary Examiner* — Kelly M Gambetta
(74) *Attorney, Agent, or Firm* — Hauptman Ham, LLP

(57) ABSTRACT

A method for manufacturing a silicon carbide thin film comprises steps of: (a) utilizing a mechanical pump to remove gases in a chamber such that the pressure in the chamber is reduced to a base pressure; (b) utilizing a microwave generator to generate microwaves at 1200 W to 1400 W so as to form microwave plasma inside the chamber; and (c) introducing into the chamber a silicon-based compound containing chlorine atoms that serve as a precursor, during the time that the temperature of a substrate disposed in the chamber is stable at 400° C. to 500° C., in which the temperature of the substrate is risen by the microwave plasma without heating the substrate additionally, so as to form a film of cubic silicon carbide on the substrate. In the present invention, the SiC thin film has good crystallinity and is manufactured by using MPECVD in a low temperature process.

6 Claims, 7 Drawing Sheets

(56) References Cited

OTHER PUBLICATIONS

So et al. Growth and structure of chemical vapor deposited silicon carbide from methyltrichlorosilane and hydrogen in the temperature range of 1100 to 1400° C., J. Vac. Sci. Tech. A (1988), 6 (1), pp. 5-8.*

Zhuang et al. Low Temperature Hetero-Epitaxial Growth of 3C-SiC Films on Si Utilizing Microwave Plasma CVD, Chem. Vap. Deposition (2013), 19, pp. 29-37.*

* cited by examiner

METHOD FOR MANUFACTURING SILICON CARBIDE THIN FILM

CROSS REFERENCE

This application claims the priority of Taiwan Patent Application No. 103108163, filed on Mar. 10, 2014.

TECHNICAL FIELD OF THE INVENTION

The present invention relates to a method for manufacturing a silicon carbide thin film, and more particularly, to a method for manufacturing a silicon carbide thin film by utilizing microwave plasma enhanced chemical vapor deposition (MPECVD).

BACKGROUND OF THE INVENTION

Silicon carbide (SiC) has very excellent physical properties such as high melting point, great hardness, high electron mobility, and high breakdown voltage. Accordingly, silicon carbide is always an important industrial material that is applicable to many technical fields, for example, machinery industry, aerospace industry, and it is also applicable to a great amount of electronic devices. Particularly, silicon carbide plays an important role in those electronic devices with high frequency and high power due to its high electron mobility, high breakdown voltage, and durable in high-temperature environment.

Silicon carbide consisted of silicon layers and carbon layers interlaced with each other features more than 200 polytypes. Silicon carbide can be classified into cubic phase, hexagonal phase, and rhombohedral phase. Cubic silicon carbide is referred to β-SiC while other phases are referred to α-SiC. Cubic silicon carbide (also called 3C—SiC) has attracted a lot of interest since it has the highest electron mobility and anisotropic electrical property. Compared to silicon-based element, the band gap of silicon carbide is much wider such that it can prohibit electrons from being exited to conduction band due to heat. Leakage of electricity is occurred at a temperature higher than 250° C. for silicon-based materials but silicon carbide element is operative at 650° C. In addition, the breakdown voltage of silicon carbide reaches 3V/μm such that silicon carbide is applicable to high-power element. Silicon carbide is called a third-generation semiconductor material with wide band gap after silicon and gallium arsenide.

There are many manufacture methods used to produce silicon carbide. Amongst, chemical vapor deposition (CVD) is a main approach to deposit a silicon carbide thin film on a substrate. For example, approaches to manufacture silicon carbide includes furnace, hot-filament, rf-plasma, and microwave plasma chemical vapor depositions. For electronic device applications, furnace CVD is usually adopted in order to deposit an uniform signal crystal epi-layer of a large area. This approach can be classified into homo-epitaxy formation on a silicon carbide substrate and hetero-epitaxy formation on a silicon substrate or other crystal substrates.

Although furnace CVD can yield high film quality, the temperature in such a manufacturing process is 1300 to 1500° C., which is higher than many types of metal substrates or even is close to the melting point of the silicon substrate. This approach causes many problems such as interdiffusion and substrate warping due to different thermal expansion, and therefore the application of this approach is dramatically restricted. In addition, the thin films fabricated by hot-filament or plasma CVD are usually polycrystalline or amorphous films. These films have high defect and high grain boundary density, and therefore they are not applicable to electronic device applications. They usually serve as interposers or super hard protection layers.

Therefore, how to solve above problems and manufacturing silicon carbide thin films with high quality at low process temperature are important issues in this industry.

SUMMARY OF THE INVENTION

An objective of the present invention is to provide a method for manufacturing a silicon carbide thin film, which is manufactured by using microwave plasma enhanced chemical vapor deposition (MPECVD) in a low temperature process.

To achieve the above objective, the present invention provides a method for manufacturing a silicon carbide thin film, which comprises steps of: (a) utilizing a mechanical pump to remove gases in a chamber such that the pressure in the chamber is reduced to a base pressure; (b) utilizing a microwave generator to generate microwaves at 1200 W to 1400 W so as to form microwave plasma inside the chamber; and (c) introducing into the chamber a silicon-based compound containing chlorine atoms and/or molecules containing chlorine atoms that serve as a precursor, during the time that the temperature of a substrate disposed in the chamber is stable at 400° C. to 500° C., in which the temperature of the substrate is risen by the microwave plasma without heating the substrate additionally, so as to form a film of cubic silicon carbide on the substrate.

In another aspect, the present invention provides a method for manufacturing a silicon carbide thin film, which comprises steps of: (a) utilizing a mechanical pump to remove gases in a chamber such that the pressure in the chamber is reduced to a base pressure; (b) utilizing a microwave generator to generate microwaves at 1200 W to 1400 W so as to form microwave plasma inside the chamber; and (c) introducing into the chamber a silicon-based compound and/or molecules containing carbon and silicon atoms that serve as a precursor, during the time that the temperature of a substrate disposed in the chamber is stable at 400° C. to 500° C., in which the temperature of the substrate is risen by the microwave plasma without heating the substrate additionally, so as to form a film of cubic silicon carbide on the substrate.

In the preferred embodiments of the present invention, the precursor containing chlorine atoms may be implemented by dichlorodimethylsilane (DDS) and the precursor not containing chlorine atoms may be implemented by adopting tetramethylsilane (TMS). The SiC thin film fabricated in DDS process has good crystallinity and large gran size, and also has an apparent preferred direction and a columnar-like structure on the sidewall of the film. Although the SiC thin film fabricated in TMS process has small grain size and high grain boundary density as compared to the film obtained by using DDS process, TMS process is an environmentally friendly process and it is also a good option to fabricate the SiC thin film.

DETAILED DESCRIPTION OF THE INVENTION

In the preferred embodiments of the present invention, microwave plasma enhanced chemical vapor deposition (MPECVD) is utilized to grow a silicon carbide (SiC) thin film at low temperature in a low-pressure gas ambience diluting a precursor with a large amount of hydrogen gas. In the present invention, a silicon carbide thin film with good crystallinity can be obtained at a substrate temperature no higher than 400° C. (preferably, 500° C.) under the circumstance of a non-heating process, i.e., without heating the substrate additionally. The low-temperature process greatly increases the range of applications of the silicon carbide thin film, which can be coated on a surface of tool steel, metal, or a glass substrate. The applications of the present invention may range from electronic elements, barrier layers for ion implantation, optoelectronic devices, tool steel, and interposers for growing diamond films to superhard thin films, and they are all applied quite well.

Figure 1:
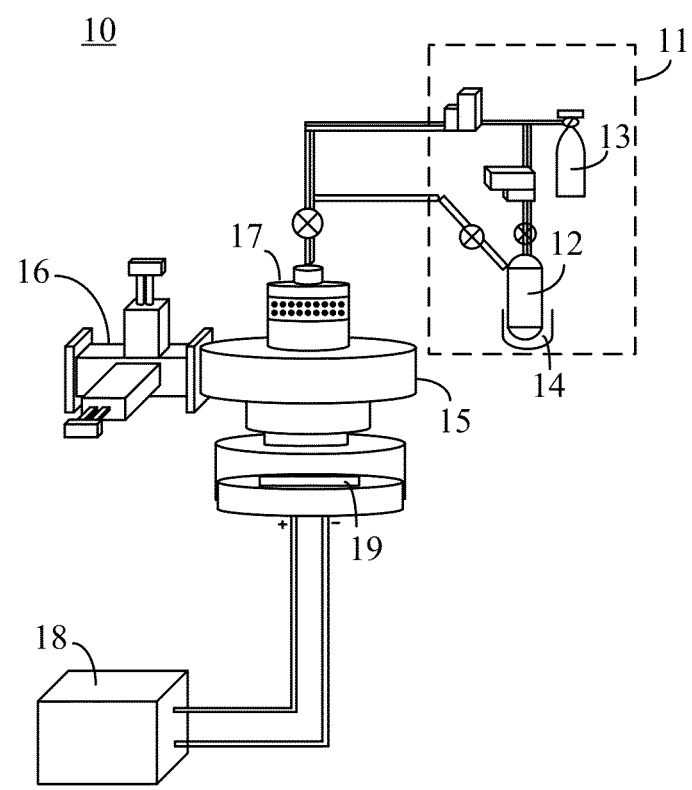
FIG. 1 is a schematic diagram showing a coating system in accordance with a preferred embodiment of the present invention.

FIG. 1 is a schematic diagram showing a coating system in accordance with a preferred embodiment of the present invention. In the coating system 10, a gas supplying portion 11 at least comprises a precursor 12 and a bottle of hydrogen gas 13. The gas supplying portion 11 has a pipe for transporting the hydrogen gas 13. The hydrogen gas 13, serving as a carrier gas, flows past the bottle of the precursor 12 along that pipe so as to carry the precursor 12 existed in vapor form in the precursor bottle. The gas supplying portion 11 also may comprise a refrigerant 14 arranged around the precursor 12. The vapor pressure of the precursor 12 may be controlled by adjusting its temperature using the refrigerant 14. The gas supplying portion 11 also may comprise process gases such as methane, nitrogen, hydrogen, and argon, the flow rates of which may be controlled by mass flow controllers. These process gasses may meet together and then flow into a camber 15. A pumping pipe 16 is communicated with a rotary pump. The interior of the chamber 15 is evacuated by the rotary pump via the pumping pipe 16. The evacuation may make the pressure in the chamber 15 achieve $4 \times 10^{-2}$ Torr (called base pressure), approximately. The pressure in the chamber 15 may be controlled by using an automatic feedback pressure controller, which may comprise a vacuum gauge and a variable valve. A microwave generator 17 is used to generate microwaves, which are then introduced into the chamber 15 from interior peripheral space thereof by means of an applicator or a waveguide. The microwaves are adjusted such that they are coupled in an annular resonator and form a plasma body at a center of the chamber 15 by means of quartz glass.

In addition, a water-cooling system may be deployed around the microwave generator 17 for removing the heat in accompanying with the generation of the microwaves. A power supply 18 provides electricity required by electronic elements. For example, the power supply 18 supplies a thermocouple thermometer, which is used to measure the temperature of a substrate 19 or the temperature near the substrate 19. In addition, depending on the requirement of the manufacturing processes, a residual gas collecting portion may be incorporated for capturing by-products such as hydrochloric acid so as to avoid the rotary pump being eroded.

The present invention uses a microwave plasma enhanced chemical vapor deposition (MPECVD) system to fabricate silicon carbide (SiC) thin films. In the preferred embodiments of the present invention, the microwave source frequency is 2.45 GHz. After passing a circulator, the microwaves are modified by an adjustor such as an E-H tuner so as to change their directions. A magnetron may generate microwaves with mode TE100 and the generated microwaves may enter the chamber from interior peripheral space of the chamber via a coupler. This energy ionizes the gases in the chamber and makes the gases turn into plasma.

Figure 2:
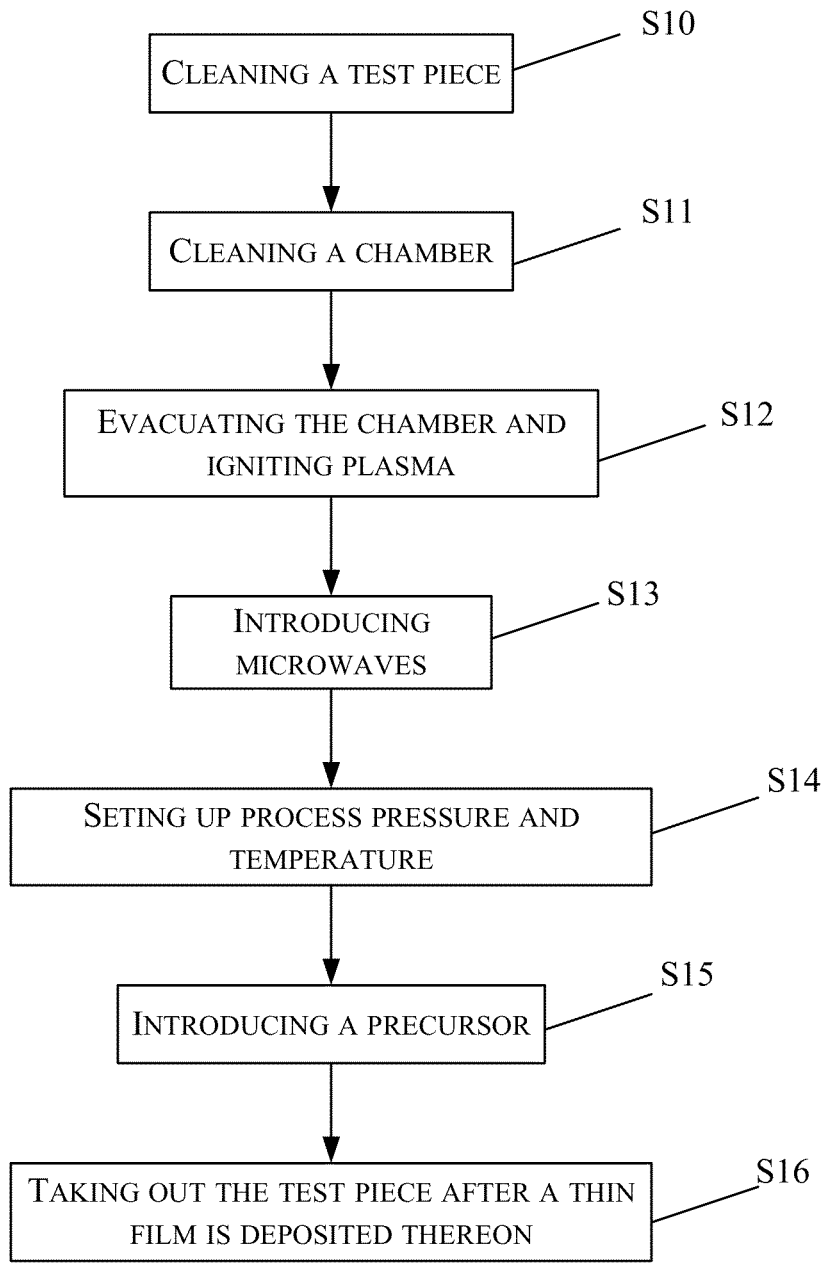
FIG. 2 is a flow chart of a method for manufacturing a silicon carbide thin film in accordance with a preferred embodiment of the present invention.

Referring to FIG. 2, a method for manufacturing a silicon carbide thin film in accordance with a preferred embodiment of the present invention will be detailed as follows.

In Step S10, a test piece is cleaned. Firstly, the test piece is put into acetone and washed with ultrasonic sound for 45 minutes so as to remove oil dirt and organic matter on the surface thereof. Then, the test piece is dipped in a solution of 10% hydrofluoric acid in water for 30 seconds so as to remove oxide on the surface. After that, the test piece is placed in a chamber and the interior of the chamber is evacuated. The surface of the test piece is activated by bombarding the surface with highly-ionized hydrogen (or called hydrogen plasma) for 30 minutes before subsequent processes.

In Step S11, the chamber is cleaned. In this step, argon and nitrogen are fed into the chamber to break vacuum. After opening the chamber, isopropyl alcohol (IPA) is used to wipe the inner surface of the chamber so as to remove residual powder. Then, with fully turned-on solenoid valves, the hydrogen plasma at 1000 W, 1 Torr is used to clean the chamber for 30 minutes. The chamber is opened after it is cooled. Then, the cleaned substrate (i.e., the test piece) is placed at a center of a carrier.

In Step S12, the chamber is evacuated and then plasma is ignited. After closing the chamber, a rotary pump is utilized to pump air out such that the base pressure in the chamber is approximately $5 \times 10^{-2}$ Torr. After that, hydrogen and nitrogen are used to purge the chamber for three to five times. Then, hydrogen is again introduced into the chamber for igniting plasma.

In Step S13, microwaves are brought in. When the introduced hydrogen makes the pressure in the chamber rise up to 1 Torr, a microwave source and a water-cooling system are turned on. The microwave source is adjusted to 1200 W and the reflection rate is reduced to a minimum by using an E-H tuner.

In Step S14, process pressure and temperature are set up. After the plasma is stable, start to increase the pressure in the chamber until the pressure reaches a predetermined process pressure. When a carrier is heated by the plasma, the temperature of the carrier may increase to 400° C. (or 500° C.), approximately. At that time, the pressure in the chamber is stable as well as the temperature of the carrier.

In Step S15, a precursor is introduced. In this step, a valve of a precursor bottle is opened after the substrate is bombarded by hydrogen plasma for 30 minutes and the process temperature is stable in Step S14, that is, the temperature of the carrier is maintained at approximately 400° C. (or 500° C.) without heating the substrate or the carrier additionally. Wait for about three minutes and then slowly increase the flow rate of a carrier gas (i.e., hydrogen) until reaction condition is met. The reaction is sustained for two hours.

In Step 16, the test piece or substrate is taken out after a thin film is deposited thereon. The valve of the precursor bottle is closed after the manufacturing process is finished. Stop the diluting gas flow (i.e., hydrogen) and slowly decrease the pressure in the chamber and the power of the microwave source after the surface of the test piece is cleaned by hydrogen plasma for 15 minutes. Then, shut down the microwave source and fill the chamber with argon and nitrogen. The test piece is cooled at normal temperatures for one hour and then is taken out from the chamber.

In the preferred embodiments of the present invention, the precursor may be a precursor containing chlorine atoms or a precursor not containing chlorine atoms. For example, the precursor having chlorine atoms may be implemented by chlorotrimethylsilane ($C_3H_9ClSi$), dichlorodimethylsilane ($C_2H_6Cl_2Si$), methyltrichlorosilane ($CH_3Cl_3Si$), chloroethane ($C_2H_5Cl$), 1,1,1-trichloroethane ($C_2H_3Cl_3$), or other compounds containing Si—Cl bond, and the precursor not containing chlorine atoms may be implemented by dimethylsilane ($C_2H_8Si$), trimethylsilane ($C_3H_{10}Si$), tetramethylsilane ($C_4H_{12}Si$), or other compounds containing Si—C bond or Si—CH3 bond.

For instance, dichlorodimethylsilane (DDS) is adopted as the precursor, and in this case, several sets of process parameters are adopted as listed in Table 1 as follows.

TABLE 1

| | Power (W) | Pressure (Torr) | Diluting gas, $H_2$ (SCCM) | Carrier gas, $H_2$ (SCCM) | Distance to the center (mm) |
|---|---|---|---|---|---|
| DDS-a | 1400 | 5 | 200 | 10 | 40 |
| DDS-b | 1400 | 10 | 200 | 10 | 40 |
| DDS-c | 1400 | 20 | 200 | 10 | 40 |
| DDS-d | 1200 | 5 | 200 | 10 | 40 |
| DDS-e | 1600 | 5 | 200 | 10 | 40 |
| DDS-f | 1200 | 5 | 200 | 1 | 40 |
| DDS-g | 1200 | 5 | 200 | 5 | 40 |
| DDS-h | 1200 | 5 | 200 | 5 | 50 |
| DDS-j | 1200 | 5 | 200 | 5 | 30 |

As seen from DDS-a, DDS-b, and DDS-c that only change the pressure in the chamber, the following speculation can be made from the analysis result of optical emission spectroscopy (OES). Increasing the pressure may make free radicals and species, which are generated by dissociating in a plasma body, hard to reach the surface of the substrate to form a thin film since the frequency of collision is increased. This reduces the deposition rate. If only the power of the microwave source is changed (see DDS-d, DDS-a, and DDS-e), it can be found that carbon ratio in the thin film starts to increase at 1400 W and 1600 W by analyzing the result from Raman spectrometer. An assumption for this result is made below. Altering the power mainly changes the dissociation rate produced in the plasma and this results in density change of the free radicals and species such that the concentration of free radicals related to carbon is increased. This may be a main reason for the carbon deposition. By adjusting the power and the pressure through above experiments, it can be found the most appropriate ranges of power and pressure for growing a thin film of crystalline silicon carbide.

Next, fine adjustment is made to the plasma environment by changing the flow rate of carrier gas (see DDS-f, DDS-g, and DDS-d) and the film quality is to be observed. From the experimental results, it can be concluded that the effect of the flow rate of carrier gas on the quality and structure of the film is insignificant. However, the rate of film formation is too slow at 1 SCCM. It is only about 200 nm per hour. At 10 SCCM, the surface roughness of the film increases, and approximately increases to 20 nm above. The flow rate of 5 SCCM may serve as an optimal parameter. In addition, the distance between the silicon substrate and a center of the plasma is altered (see DDS-g, DDS-h, and DDS-j) for observing the variation of thin film. From the pictures taken by SEM, it can be known that the average grain diameter and the film formation rate are apparently increased as the substrate gets closer and closer to the center of the plasma. The structural order of the film formed at 30 mm is much higher that at 40 mm. An assumption for this result is accordingly made below. The shorter the distance between the substrate and the center of the plasma, the higher the disassociation rate of the plasma. Since gas temperature approaches electron temperature at a relative short distance, the temperature near the substrate is much higher. This makes the rate of grain formation (i.e., the rate of film formation) increase.

The properties of a silicon carbide thin film manufactured by using a preferred set of parameters (i.e., DDS-j) are shown in Table 2 as follows.

TABLE 2

| | Average grain size (nm) | Columnar-like structure | Thickness (nm) | 3C-SIC[TO] Raman FWHM ($cm^{-1}$) | 3C-SIC XRD FWHM <111> (degree) |
|---|---|---|---|---|---|
| DDS-j | 150 | Y | 1400 | 20 | 0.35 |

Figure 3A:
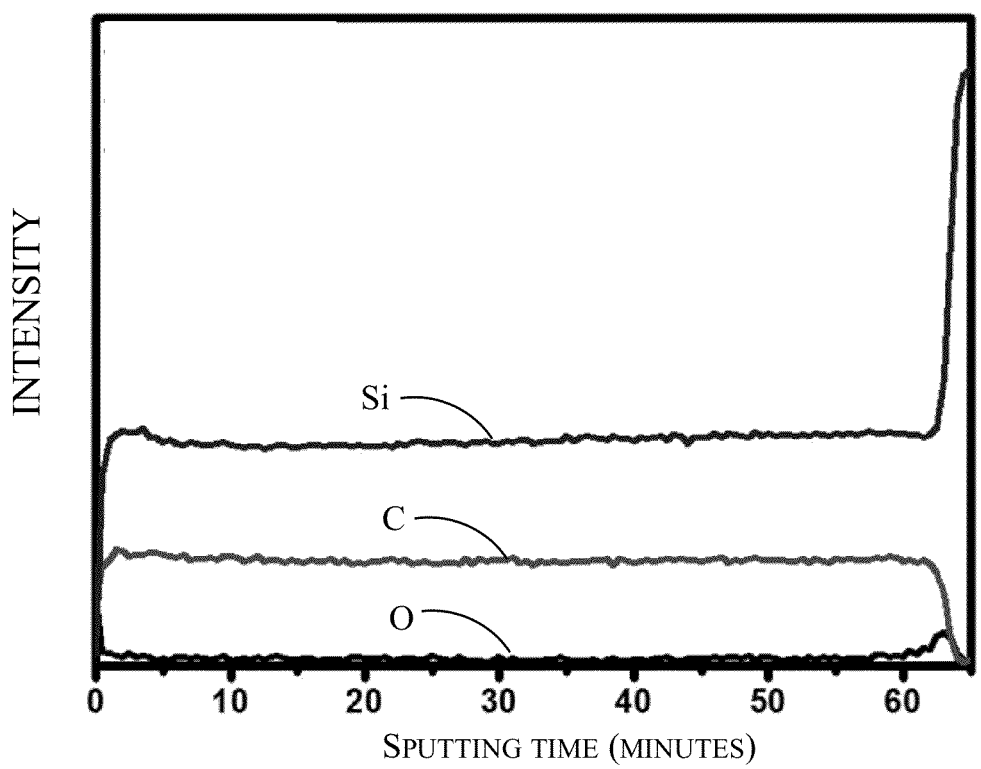
FIG. 3A is a diagram showing AES (auger electron spectroscopy) analysis result of a thin film fabricated by adopting dichlorodimethylsilane (DDS) as a precursor in accordance with a first preferred embodiment of the present invention.
Figure 3B:
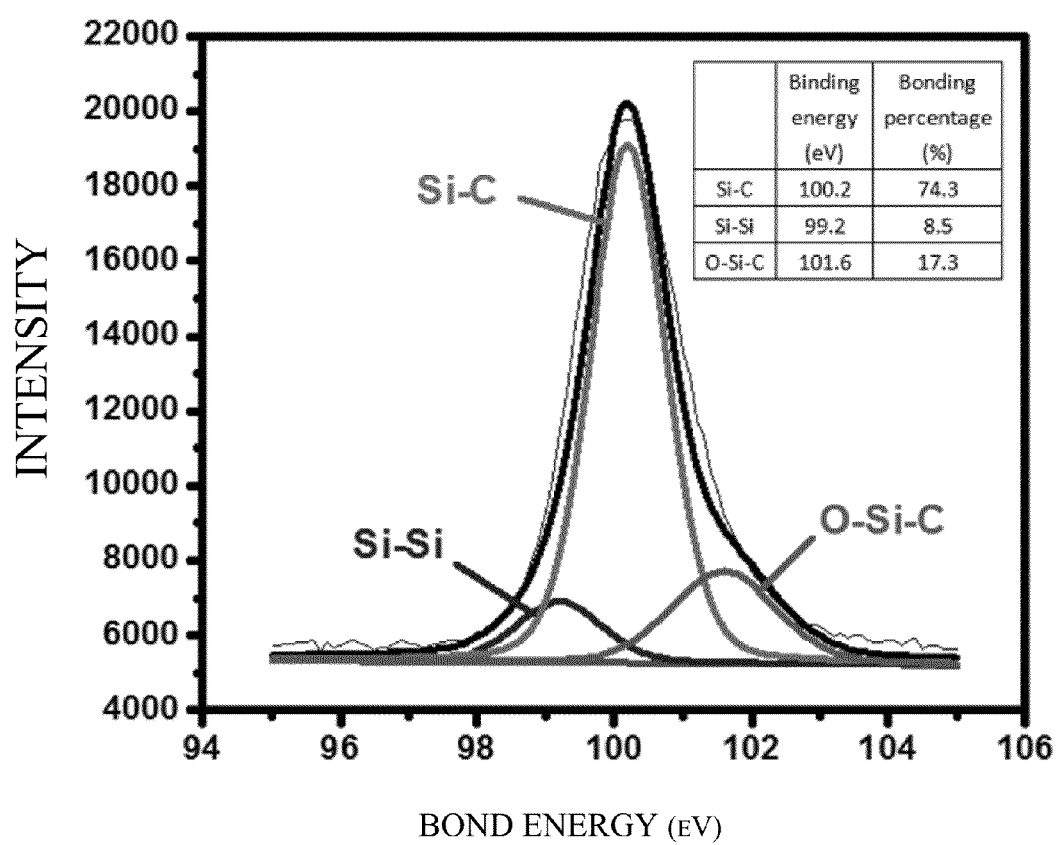
FIG. 3B is a diagram showing XPS analysis result of the thin film fabricated in DDS process in accordance with the first preferred embodiment of the present invention.
Figure 3C:
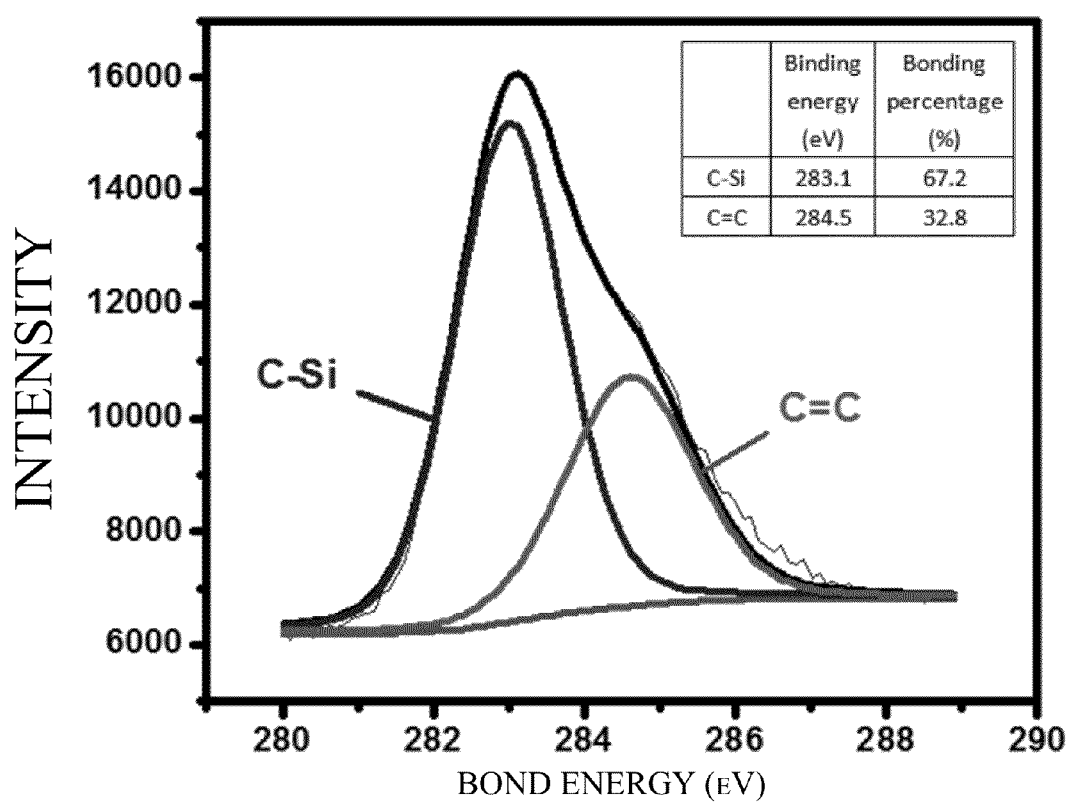
FIG. 3C is a diagram showing XPS analysis result of the thin film fabricated in DDS process in accordance with the first preferred embodiment of the present invention.

The element profile analysis shown in FIG. 3A by using auger electron spectroscopy (AES) is constructed by intensity vs depth. Qualitative analysis shows that the fabricated thin film is an uniform film. The constituent of the film does not significantly change as depth changes. The thin film is consisted mainly of carbon, silicon, and oxygen. As shown in FIG. 3B, silicon peaks measured by XPS show that most of silicon atoms of the thin film bond with carbon atoms and a small percentage of Si—Si and Si—O is formed. The formation of Si—Si and Si—O may come from silicon atoms segregated from the thin film and residual oxygen gas in the chamber, which causes oxygen atoms to incorporate into the silicon carbide thin film. From carbon peaks measured by XPS in FIG. 3C, it can also be known that expect for Si—C, the thin film still has a small amount of carbon atoms linked with double bonds (i.e., C=C), which are existed in a non-crystalline form.

In another case, tetramethylsilane (TMS) is adopted as the precursor. Several sets of process parameters adopted in this case are listed in Table 3 as follows.

TABLE 3

| | Power (W) | Pressure (Torr) | Diluting gas, $H_2$ (SCCM) | Carrier gas, $H_2$ (SCCM) | Distance to the center (mm) |
|---|---|---|---|---|---|
| TMS-a | 1400 | 5 | 350 | 5 | 40 |
| TMS-b | 1400 | 10 | 350 | 5 | 40 |
| TMS-c | 1400 | 15 | 350 | 5 | 40 |
| TMS-d | 1200 | 10 | 350 | 5 | 40 |

TABLE 3-continued

| | Power (W) | Pressure (Torr) | Diluting gas, $H_2$ (SCCM) | Carrier gas, $H_2$ (SCCM) | Distance to the center (mm) |
|---|---|---|---|---|---|
| TMS-e | 1600 | 10 | 350 | 5 | 40 |
| TMS-f | 1400 | 10 | 350 | 5 | 30 |
| TMS-g | 1400 | 10 | 350 | 5 | 20 |

The properties of a silicon carbide thin film manufactured by using a preferred set of parameters (i.e., TMS-g) among above parameter sets are shown in Table 4 as follows.

TABLE 4

| | Average grain size (nm) | Columnar-like structure | Thickness (nm) | 3C-SIC[TO] Raman FWHM ($cm^{-1}$) | 3C-SiC XRD FWHM<111> (degree) |
|---|---|---|---|---|---|
| TMS-g | 50 | N | 812 | 50 | 0.47 |

Figure 4A:
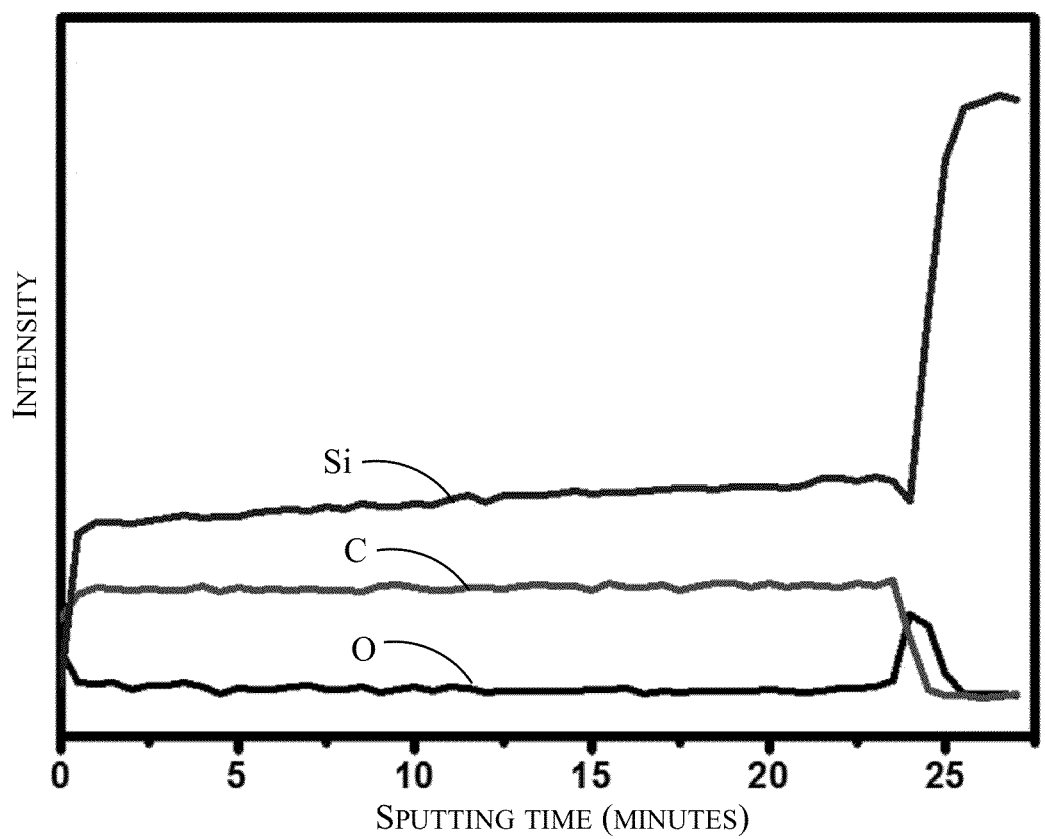
FIG. 4A is a diagram showing AES analysis result of a thin film fabricated by adopting tetramethylsilane (TMS) as a precursor in accordance with a second preferred embodiment of the present invention.
Figure 4B:
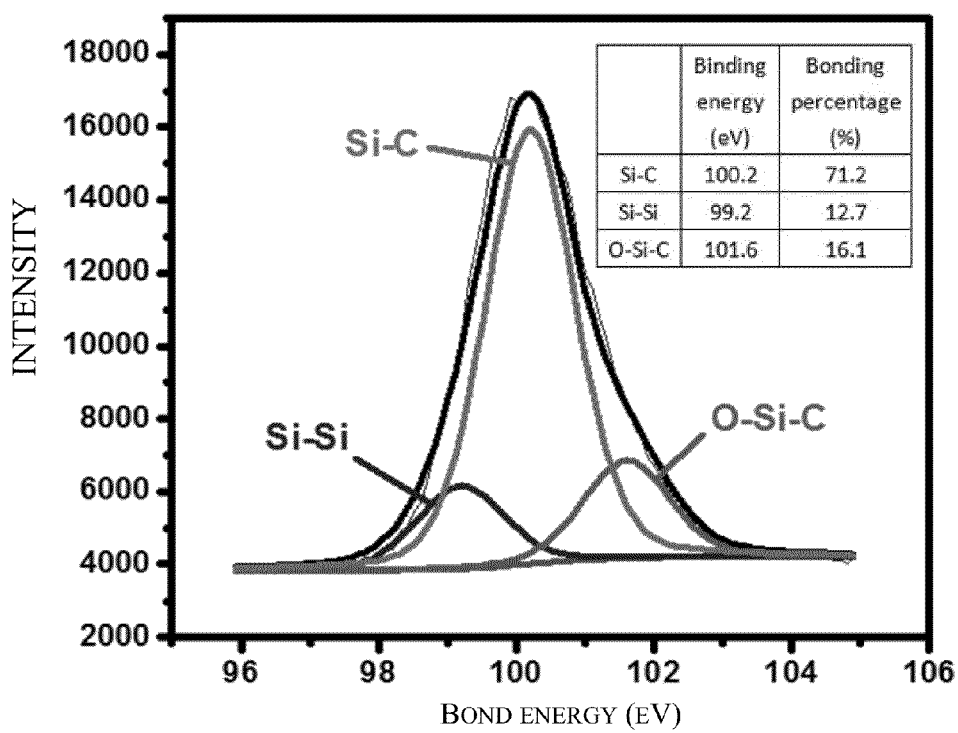
FIG. 4B is a diagram showing XPS analysis result of the thin film fabricated in TMS process in accordance with the second preferred embodiment of the present invention.
Figure 4C:
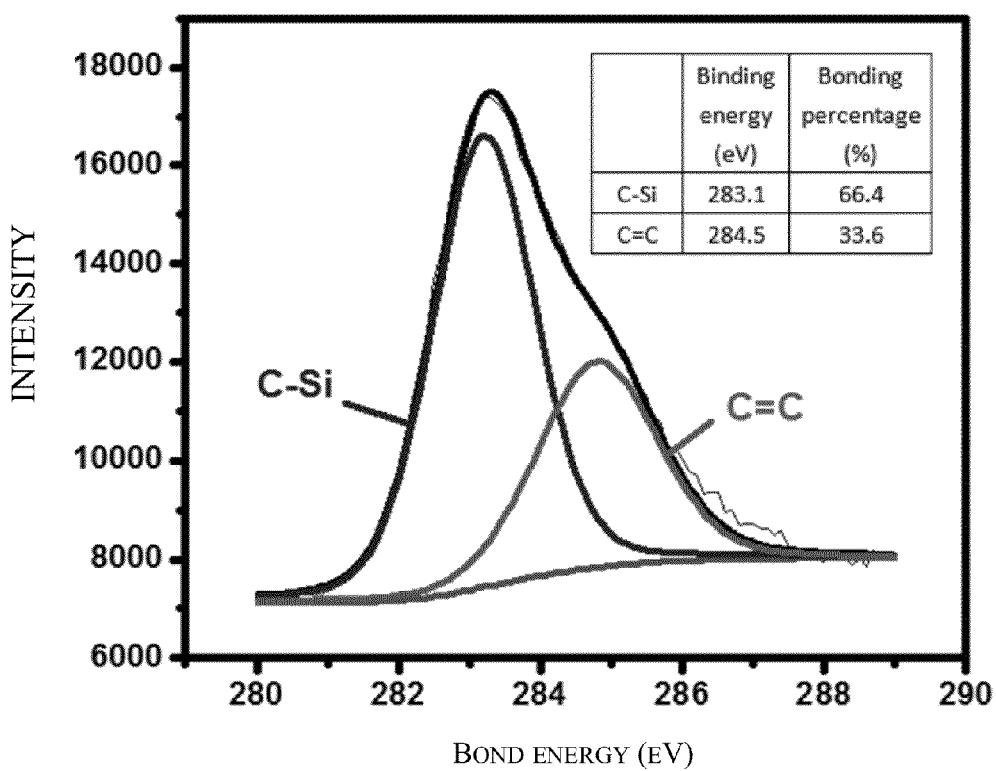
FIG. 4C is a diagram showing XPS analysis result of the thin film fabricated in TMS process in accordance with the second preferred embodiment of the present invention.

The element profile analysis in FIG. 4A by using AES shows that the thin film is consisted mainly of carbon, silicon, and oxygen. The constituent of the film does not change as depth changes and the intensity distribution of the constituent is quite uniform. From the XPS measurement results in FIG. 4B, it can be known that the bonding and the amount of content in the film reveal that most of silicon atoms bond with carbon atoms. The binding energy of Si—C bond is 100.2 eV. In addition, there is a small amount of Si—Si bond and Si—O bond. From the XPS measurement results in FIG. 4C, it can be known that carbon atoms mainly bond with silicon atoms but there exists some carbon atoms linked with double bonds (i.e, C=C).

As seem from the silicon carbide thin films fabricated by DDS process (e.g., DSS-j) and TMS process (e.g., TMS-g), the average grain size obtained from DDS process is three to five times as large as the average gran size obtained from TMS process. The acquisition of a large grain means that the grain boundary proportion is decreased. Further, the thin film fabricated by DDS-j process apparently has a columnar-like structure but the thin film fabricated by TMS-g process does not have such a structure. In addition, Raman spectrum shows that the crystal structural order of the SiC film fabricated by DDS-j process is higher than that of the film fabricated by TMS-g process. It can also be found that the amount of carbon atoms segregated from the thin film in DDS-j process is less than that in TMS-g process. From XRD spectrum, it can be known that 3C—SiC film fabricated by DDS-j process has a preferred direction <111>.

From above experimental results, it can be known that introducing a precursor containing chlorine atoms or molecules containing chlorine atoms in the manufacturing process has many advantages. One advantage is to yield a more stable intermediate by bonding silicon atoms strongly with chlorine atoms such that Si—Si bond is unlikely to form. Another advantage is to enhance the etching, suppress the second nucleation, and increase opportunity of selective growth in the process such that the crystallization of SiC is improved. These actions may further increase the average grain diameter, decrease the grain boundary proportion, and reduce an amount of carbon atoms or silicon atoms segregated from the grain boundary. Accordingly, the introduction of chlorine plays an important role in the low temperature process.

Although the quality of thin film fabricated by using a silicon-based compound not containing chlorine atoms (e.g., tetramethylsilane (TMS)) as a precursor is less than that of the film fabricated by using a silicon-based compound containing chlorine atoms and/or molecules containing chlorine atoms, the use of tetramethylsilane has many advantages including easily accessible, nontoxic, noncorrosive, not harmful to the environment. It is quite an environmentally friendly process. As awareness of environmental protection is increased nowadays, adopting a silicon-based compound not containing chlorine atoms as a precursor produces relatively little pollution. It is quite an applicable option.

In the preferred embodiments of the present invention, dichlorodimethylsilane (DDS) is adopted as a precursor and microwave plasma enhanced chemical vapor deposition (MPECVD) is utilized to fabricate the thin film without heating the silicon substrate additionally. When the temperature of the silicon substrate is 400° C. (or preferably, 500° C.), a thin film of cubic silicon carbide is fabricated on the silicon substrate. Its average grain size is roughly 100 to 150 nm. In XRD spectrum, FWHM (full-width-at-half-maximum) on peak along <111> direction is 20=0.35 degrees. This shows that a thin film with good crystallinity is obtained. As to adopting tetramethylsilane (TMS) as a precursor, a thin film of cubic silicon carbide is fabricated on the silicon substrate at 430° C. (or preferably, 500° C.) without heating the silicon substrate additionally. The average grain size of the fabricated film is roughly 50 nm (the range of 50 to 100 nm is also possible). Its crystalline structure is less ordered. The crystalline characteristic and film quality obtained in TMS process is less than that obtained in DDS process.

Above all, the SiC thin film fabricated in DDS process has good crystallinity and large gran size, and also has an apparent preferred direction and a columnar-like structure on the sidewall of the film. Although the SiC thin film fabricated in TMS process has small grain size and high grain boundary density as compared to the film obtained by using DDS process, TMS process is an environmentally friendly process and it is also a good option to fabricate the SiC thin film.

While the preferred embodiments of the present invention have been illustrated and described in detail, various modifications and alterations can be made by persons skilled in this art. The embodiment of the present invention is therefore described in an illustrative but not restrictive sense. It is intended that the present invention should not be limited to the particular forms as illustrated, and that all modifications and alterations which maintain the spirit and realm of the present invention are within the scope as defined in the appended claims.

What is claimed is:

1. A method for manufacturing a silicon carbide thin film, comprising steps of:
   (a) utilizing a mechanical pump to remove gases in a chamber such that the pressure in the chamber is reduced to a base pressure;
   (b) utilizing a microwave generator to generate microwaves at 1200 W to 1400 W so as to form microwave plasma inside the chamber; and
   (c) introducing into the chamber a silicon-based compound containing chlorine atoms and/or molecules containing chlorine atoms that serve as a precursor, during the time that the temperature of a substrate disposed in the chamber is stable at 400° C. to 500° C., in which the temperature of the substrate is risen by the microwave plasma without heating the substrate additionally, so as to form a crystalline silicon carbide film on the substrate, wherein in Step (c), the pressure in the chamber is between 5 and 10 Torr, wherein Step (c) comprises carrying the precursor by using a carrier gas, wherein the flow rate of the carrier gas is between 1 and 10 SCCM, and wherein in Step (c), the distance between the substrate and a center of the microwave plasma is between 20 and 30 mm.

2. The method according to claim 1, wherein the silicon-based compound comprises dichlorodimethylsilane (DDS).

3. The method according to claim 1, wherein the average grain size of the silicon carbide thin film is between 100 and 150 nm.

4. A method for manufacturing a silicon carbide thin film, comprising steps of:
   (a) utilizing a mechanical pump to remove gases in a chamber such that the pressure in the chamber is reduced to a base pressure;
   (b) utilizing a microwave generator to generate microwaves at 1200 W to 1400 W so as to form microwave plasma inside the chamber; and
   (c) introducing into the chamber a silicon-based compound and/or molecules containing carbon and silicon atoms that serve as a precursor, during the time that the temperature of a substrate disposed in the chamber is stable at 400° C. to 500° C., in which the temperature of the substrate is risen by the microwave plasma without heating the substrate additionally, so as to form a crystalline silicon carbide film on the substrate, wherein in Step (c), the pressure in the chamber is between 5 and 10 Torr, wherein Step (c) comprises carrying the precursor by using a carrier gas, wherein the flow rate of the carrier gas substantially is 5 SCCM, and wherein in Step (c), the distance between the substrate and a center of the microwave plasma is between 20 and 30 mm.

5. The method according to claim 4, wherein the silicon-based compound comprises tetramethylsilane (TMS).

6. The method according to claim 4, wherein the average grain size of the silicon carbide thin film is between 50 and 100 nm.

* * * * *